United States Patent
Kuwahara

(10) Patent No.: US 7,605,521 B2
(45) Date of Patent: Oct. 20, 2009

(54) HERMETICALLY SEALED STRUCTURE, PIEZOELECTRIC DEVICE AND IMPROVEMENT OF METHOD FOR MANUFACTURING THE SAME

(75) Inventor: Takuo Kuwahara, Tatsuno (JP)

(73) Assignee: Epson Toyocom Corporation (JP)

( * ) Notice: Subject to any disclaimer, the term of this patent is extended or adjusted under 35 U.S.C. 154(b) by 166 days.

(21) Appl. No.: 11/621,186

(22) Filed: Jan. 9, 2007

(65) Prior Publication Data

US 2007/0170819 A1      Jul. 26, 2007

(30) Foreign Application Priority Data

Jan. 10, 2006    (JP) .............................. 2006-002812

(51) Int. Cl.
*H01L 41/08* (2006.01)
(52) U.S. Cl. ..................................................... 310/344
(58) Field of Classification Search ................. 310/344, 310/348
See application file for complete search history.

(56) References Cited

U.S. PATENT DOCUMENTS

| | | | |
|---|---|---|---|
| 4,131,816 A * | 12/1978 | Nakata | 310/348 |
| 5,010,270 A * | 4/1991 | Greer | 310/313 D |
| 6,606,772 B1 * | 8/2003 | Nohara et al. | 29/25.35 |
| 6,680,560 B2 * | 1/2004 | Koki et al. | 310/348 |
| 6,876,264 B2 * | 4/2005 | Arai et al. | 331/68 |
| 6,924,429 B2 * | 8/2005 | Kasai et al. | 174/565 |
| 7,116,039 B2 * | 10/2006 | Arai et al. | 310/341 |

FOREIGN PATENT DOCUMENTS

JP        2005-130093        5/2005

* cited by examiner

*Primary Examiner*—Mark Budd
(74) *Attorney, Agent, or Firm*—Harness, Dickey & Pierce, P.L.C.

(57) ABSTRACT

A hermetically sealed structure in which a base substrate 31 and a lid 33 are hermetically sealed, the base substrate serving as a part of a containing body for uniformly forming or bonding an electronic part, the lid being a lid body to be hermetically bonded to the base substrate, is structured as follows: the lid is made from a material, through which light passes; as a metal layer 25 of at least a sealing portion of the lid a platable layer 22 for performing plating and a bonding layer 24 made from gold, the bonding layer being formed closer to the front side than the platable layer are formed; and the lid is structured so as to be bonded to the base substrate 31 by an Au—Ge alloy.

8 Claims, 7 Drawing Sheets

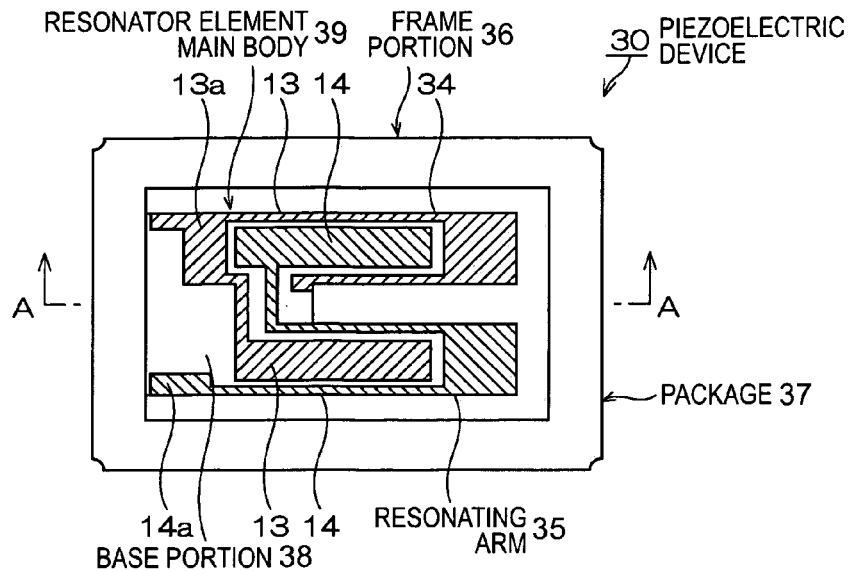
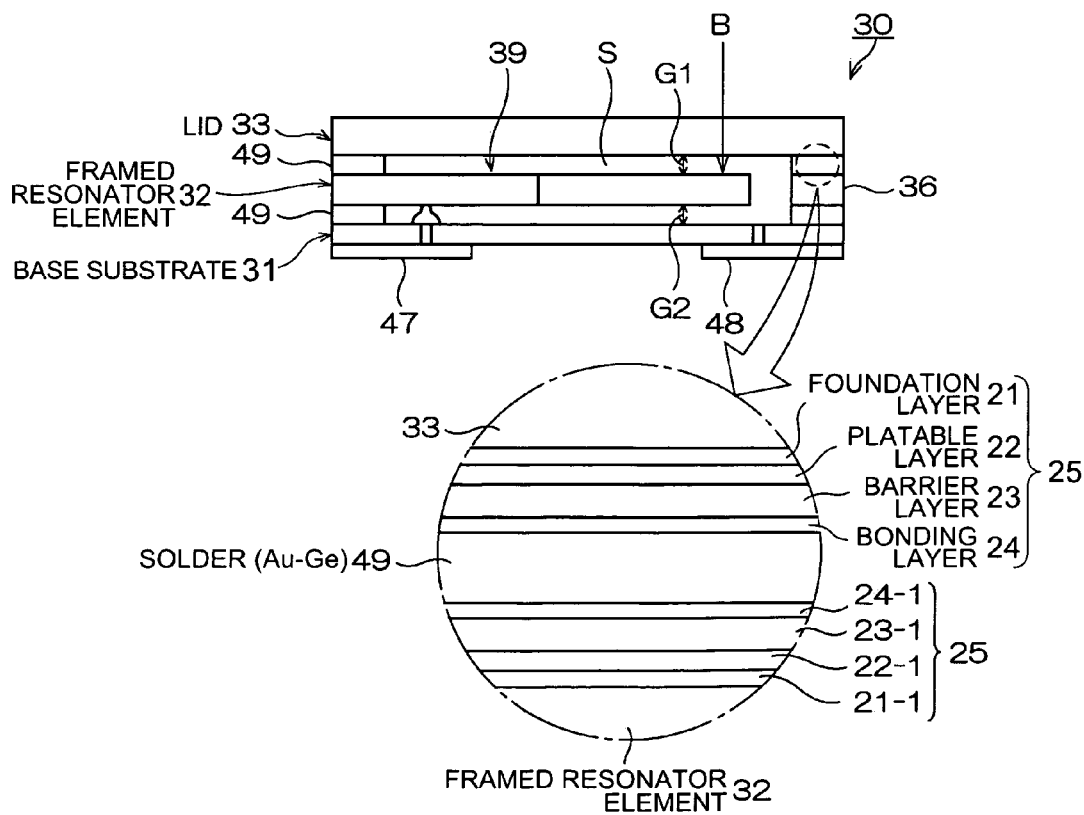

HERMETICALLY SEALED STRUCTURE, PIEZOELECTRIC DEVICE AND IMPROVEMENT OF METHOD FOR MANUFACTURING THE SAME

FIELD

The present teachings relate to a hermetic sealing structure that hermetically contains an electronic part, a piezoelectric device, and a method for manufacturing the same.

BACKGROUND

In recent years, piezoelectric devices such as piezoelectric resonators, piezoelectric oscillators are widely used in hard disk drives (HDD), mobile computers, information apparatuses such as IC cards and portable communication apparatuses such as cellular phones, phones for automobiles, and mobile communication devices such as pacing systems.

Piezoelectric devices are structured such that a piezoelectric resonator element as an electronic part is contained in a package, to which a lid as a cover body is hermetically bonded.

In piezoelectric devices, the ambient environment of the piezoelectric resonator element changes due to bonding of the lid. Therefore, there arises great necessity to accurately adjust the frequency of the piezoelectric resonator elements after sealing.

However, the lid is usually made from metal. Thus, after the package has been sealed, it is impossible to perform the frequency of the lid by performing treatment to the piezoelectric resonator element arranged therein.

In view of the above, such a piezoelectric device as shown in FIG. 10 is also proposed (refer to, for example, JP 2005-130093).

As shown in FIG. 10, the piezoelectric device 11 contains the piezoelectric resonator element 6 as an electronic part in the package 2.

An electrode portion 3 is formed in the package 2 and is electrically conducted to mounting terminals 5, 5 in the package, the mounting terminals being disposed outside of the package. Conductive adhesive 4 is applied on the top of the electrode portion 3. The lid 7 is hermetically sealed with a bottom portion of the piezoelectric resonator element 6 being laid and fixed on the top of the electrode portion 3, on which conductive adhesive 4 has been applied.

The lid 7 has an aperture, thorough which glass is mounted to thereby form a window 8.

As thus described above, even after the lid has been sealed, it is possible to perform frequency adjustment using mass reduction technique by irradiating a part of an electrode of the piezoelectric resonator element 6 with laser light LB from outside through the window 8.

However, in the case of the piezoelectric device 1 shown in FIG. 10, step for forming the window 8 by forming an aperture in a part of the lid 7 and mounting the glass through the aperture. Therefore, the process becomes complicated, which involves increase in manufacturing cost. Such step is hardly performed especially when the product itself is downsized.

Further, there is also a way to make the lid itself from glass.

In this case, when the plate member made from glass constituting the lid is bonded to the member such as a package made from ceramic, low-melting glass having melting point of 320 degrees Celsius (hereinafter, all of the temperature indications described below are based on the temperature scale of Celsius) is used as bonding material.

However, such type of low-melting glass contains lead. The use of sealing materials containing lead may lead to environmental contamination and is therefore undesirable.

Thus, low-melting glass containing no lead is used. However, such low-melting glass has melting point of more than 400 degrees, which is relatively high. Therefore, there arises a fear in that the properties of the piezoelectric resonator element itself may be deteriorated. Further, researches is made on low-melting glass having relatively low melting point, which is, however, very expensive.

In view of the above, metal film is formed on the lid made from glass and sealing materials (brazing materials) made from metal is used. As brazing materials made from metal, solder is known. In particular, solder containing no lead, that is to say, lead-free solder, is alloy made from tin, silver, copper etc. and has low temperature of about 200 to 220 degrees. Thus, there arises a fear in that lead-free solder may not withstand the reflow process when the piezoelectric device is mounted. Furthermore, when gas is generated after sealing and gas component is adhered to the piezoelectric resonator element, the Cl value is increased.

SUMMARY

The present teachings are made with the view to solving the above problem and providing a hermetically sealed structure capable of sealing the package and the lid to each other without involving environmental contamination and of accurately performing frequency adjustment, a piezoelectric device and a method for manufacturing the same.

In a first configuration, the above object is achieved by a hermetically sealed structure in which a base substrate and a lid are hermetically sealed, the base substrate serving as a part of a containing body for uniformly forming or bonding an electronic part, the lid being a lid body to be hermetically bonded to the base substrate, the hermetically sealed structure is constructed as follows: the lid is made from a material, through which light passes; as a metal layer of at least a sealing portion of the lid a platable layer for performing plating and a bonding layer made from gold, the bonding layer being formed closer to the front side than the platable layer are formed; and the lid is structured so as to be bonded to the base substrate by an Au—Ge alloy.

According to the construction of the first configuration, by forming the lid from the material, through which light passes, that is, glass other than metal, it becomes possible to perform treatment of the inside of the lid by irradiation of laser light from outside after sealing of the lid.

A metal layer is formed at least on the sealing portion of the lid, thereby making it possible to perform bonding of the lid to the package with the aid of solder made from an Au—Ge alloy.

To be more specific, the metal layer includes the platable layer, so it is possible to form a metal film on the side closer to the front side than the platable layer by plating. By forming bonding layer from gold, it is possible to carry out hermetic sealing using solder of an Au—Ge alloy.

That is to say, as solder, an alloy of gold and germanium has melting point of about 360 degrees. Therefore, the melting point of this solder is lower than that of low-melting glass without lead having high melting point of 400 degrees or more, thereby making it possible to avoid adverse effect on the piezoelectric resonator element due to high temperature at the time of bonding.

On the other hand, the solder made from, an Au—Ge alloy has relatively higher melting point than that of lead-free solder, whose temperature is low and ranges from 200 degrees to 220 degrees. Therefore, there arises no fear in that the bonding becomes loose during the reflow process at the time of mounting the piezoelectric device. Further, unlike lead-free solder, no gas is generated after sealing, so there is no disadvantage in that the Cl value increases as gas content adheres to the piezoelectric resonator element.

Further, according to a second configuration, the above object is achieved by a piezoelectric device including a base substrate, a framed resonator element to be stacked and fixed on the base substrate, and a lid to be stacked and fixed on the framed resonator element, in which: the lid is made from a material, through which light passes; as a metal layer of at least a sealing portion of the lid a platable layer for performing plating and abonding layer made from gold., the bonding layer being formed closer to the front side than the platable layer are formed; and the lid is structured so as to be bonded to the base substrate by an Au—Ge alloy.

According to the construction of the second configuration, the material, through which light passes, is formed from glass other than metal, thereby making it becomes possible to perform treatment of the inside of the lid by irradiation of laser light from outside after sealing of the lid. A metal layer is formed at least on the sealing portion of the lid, thereby making it possible to perform bonding with the aid of solder made from an Au—Ge alloy. To be more specific, the metal layer includes platable layer. Therefore, it is possible to form metal layer by plating on the side which is closer to the front side than the platable layer. The bonding layer made from gold is formed, thereby making it possible to perform hermetic sealing by using solder made from an Au—Ge alloy having the above-mentioned advantage so that the use of lead can be avoided.

As thus described above, it is possible to provide the piezoelectric device capable of being manufactured easily even if downsized, keeping the manufacturing cost low, and preventing adverse effect on the environment by avoiding lead.

A third configuration is characterized in that in the construction according to the second configuration, a foundation layer is formed on the surface of the lid in advance and the top of the platable layer includes a barrier layer for preventing solder from being corroded.

According to the construction of the third configuration, in the, case in which a metal layer is formed on the material such as glass, through which light passes and bonding is performed by using solder, it is necessary to adequately form a metal layer on the surface made from glass. In this case, a foundation layer containing chrome, titanium or the like is formed and then a metal layer for bonding is formed thereon because it is necessary to form a metal film having excellent adhesiveness to the glass between the a glass material for lid and the metal layer for bonding.

A fourth configuration is characterized in that in any one of the second and third configurations, the platable layer is, in the case of performing electroless plating, a metal layer selected from any one of AlCu, AlTi, AlSiCu and NiCr, and in the case of electrolysis plating, metal layer made from Au.

According to the construction of the fourth configuration, when the metal layer is formed by plating, aluminum is adequate in order to make it possible to perform electroless plating. However, aluminum only has insufficient water tightness, so it is preferable to use for a platable layer any gold layer selected from AlCu, AlTi and AlSiCu. In this case, it is desirable that the respective additive elements of an Al alloy, which are Cu, Ti, and SiCu, be 1% or less with respect to the matrix constituent of Al.

It is also possible to use NiCr other than an Al alloy.

In order to make it possible to perform electrolysis plating, Au is used so that Ni electrolysis plating can be deposited.

Note that the foundation layer is not necessary when AlCu, AlTi, AlSiCu or NiCr is used for the platable layer.

A fifth configuration is characterized in that in the construction according to any one of the second through the fourth configuration, the base substrate, the framed resonator element and the lid are all made from quartz.

According to the construction of the fifth configuration, when the lid is made from quartz, light passes through quartz. Therefore, quartz is preferably used for performing frequency adjustment by irradiation with laser or the like from outside after sealing. Quartz is a piezoelectric material and therefore preferably used for forming the framed resonator element. Quartz is an insulating material and therefore preferably used for the base substrate. It is preferable when those framed resonator element and base substrate be bonded to each other by solder because the linear coefficients of expansion thereof coincident with each other, involving no fear in that damage occurs due to change in temperature environment.

A sixth configuration is characterized in that in the construction according to any one of the second through the fourth configuration, the base substrate and the lid are made from glass and the framed resonator element is made from quartz.

According to the construction of the sixth configuration, only the framed resonator element must be made from a piezoelectric material, so quartz is selected as the material therefor. The lid must be transparent and is therefore made from glass. The base substrate must have insulating properties and is therefore be preferably made from glass. As those glasses, ones having linear coefficients of expansion closely analogues to those of quartz, it becomes possible to provide a product, which is not easily damaged even if temperature environment changes.

A seventh configuration is characterized in that in the construction according to any one of the second through sixth configurations, a metal layer identical to the metal layer is formed on each of a sealing portion of the framed resonator element and a sealing portion of the base substrate.

According to the construction of the seventh configuration, the same metal layer as of the above mentioned metal layer is preferably provided on each of the surfaces of the material to be bonded, when the bonding is performed by using Au—Ge.

Further, according to an eighth configuration, the above-mentioned object is achieved by a method for manufacturing a piezoelectric device including the steps of forming a base substrate layer constituting a base substrate, an element layer constituting a framed piezoelectric resonator element and a lid layer constituting a lid, those layers each having size corresponding to that of a plurality of products, the number of which is common to all of those layers, forming, for metal layers for each of sealing portions of the base substrate layer, the element layer and the lid layer, a platable layer for forming plating, a barrier layer for preventing gold corrosion, the barrier layer being formed to be closer to the front side than the platable layer, and a bonding layer made from gold and formed to be closer to the front side than the barrier layer, stacking the base substrate layer, the element layer and the lid layer on each other and fixing them by Au—Ge solder, cutting, after stacking and fixing, those layers respectively in the size corresponding to the size of the respective products.

According to the construction of the eighth configuration, in accordance with the same principle of the second configuration, it becomes possible to prevent adverse effect on environment by avoiding lead and further achieve drastic enhancement in productivity because a plurality of products can be manufactured at the same time.

Further, according to a ninth configuration, the above-mentioned object is achieved by a piezoelectric device including a base substrate, a piezoelectric resonator element fixed to the base substrate, a lid as a lid body made from glass to be hermetically bonded to the base substrate or a package including the base substrate, in which: a metal film including gold at the position to be bonded to the lid is formed on the base substrate or the package including the base substrate; a lid side metal film for bonding is formed on a bonding surface of the lid other than the position corresponding to a metal film for frequency adjustment provided on the piezoelectric resonator element after bonding; the metal film of the base substrate or the package including the base substrate and the lid side metal film of the lid are bonded and sealed by melting solder made from an Au—Ge alloy; and the base substrate or the package has a thorough hole for sealing, the through hole for sealing being sealed by a filler material.

According to the construction of the ninth configuration, the lid is made from glass and the lid side metal film for bonding is formed except the position corresponding to the metal film for frequency adjustment provided on the piezoelectric resonator element after bonding. Therefore, it becomes possible to perform, after sealing of the lid, frequency adjustment according to mass reduction technique by irradiation with laser light from outside and making a part of the metal film such as the electrode of the piezoelectric resonator element in the package to transpire.

Furthermore, an Au—Ge alloy is used for bonding of the lid made from glass, so it becomes possible to withstand even the heat at the time of reflowing in mounting the piezoelectric device. At the same time, it becomes possible to prevent adverse effect on the piezoelectric resonator element at the time of sealing of the lid.

Moreover, the package includes the through hole for sealing. It becomes possible to discharge gas from the package through the through hole and to seal the through hole.

As described above, it becomes possible to provide a piezoelectric device having a structure capable of sealing the package and the lid without fear of environmental contamination, performing accurate frequency adjustment, and preventing the Cl value from increasing.

A tenth configuration is characterized in that in the construction according to the ninth configuration, the solder is pre-coated on the bonding surface of the lid.

According to the construction of the tenth configuration, the solder is pre-coated on the lid side in advance, so it becomes possible to eliminate cumbersome tasks such as alignment of the ring-shaped solder between the package and the lid.

An eleventh configuration is characterized in that in the construction according to any one of the ninth and the tenth configurations, the solder or the lid side metal film and the solder are provided in the area defined within the bonding surface of the base substrate or the package of the lid.

According to the construction of the eleventh configuration, it is possible to use the minimum amount of the lid side metal film, the solder or the like, thereby making it possible to prevent unnecessary spreading out of metal, which is not to be bonded, unnecessary use of expensive materials such as gold, or the like.

A twelfth configuration is characterized in that in the construction according to any one of the ninth through eleventh configurations, the base substrate or the package has a through hole for sealing and the through hole for sealing is sealed by filling a metal material.

According to the twelfth configuration, at the time of bonding of the lid, the through hole is used so that gas is discharged from the package and then the through hole is sealed, thereby making it possible to eliminate adverse effect due to gas.

DRAWINGS

FIG. 1 is a schematic plan view showing a configuration of a piezoelectric device according to the present teachings;

FIG. 2 is a schematic sectional view taken along the line A-A of FIG. 1;

DETAILED DESCRIPTION

Figure 3:
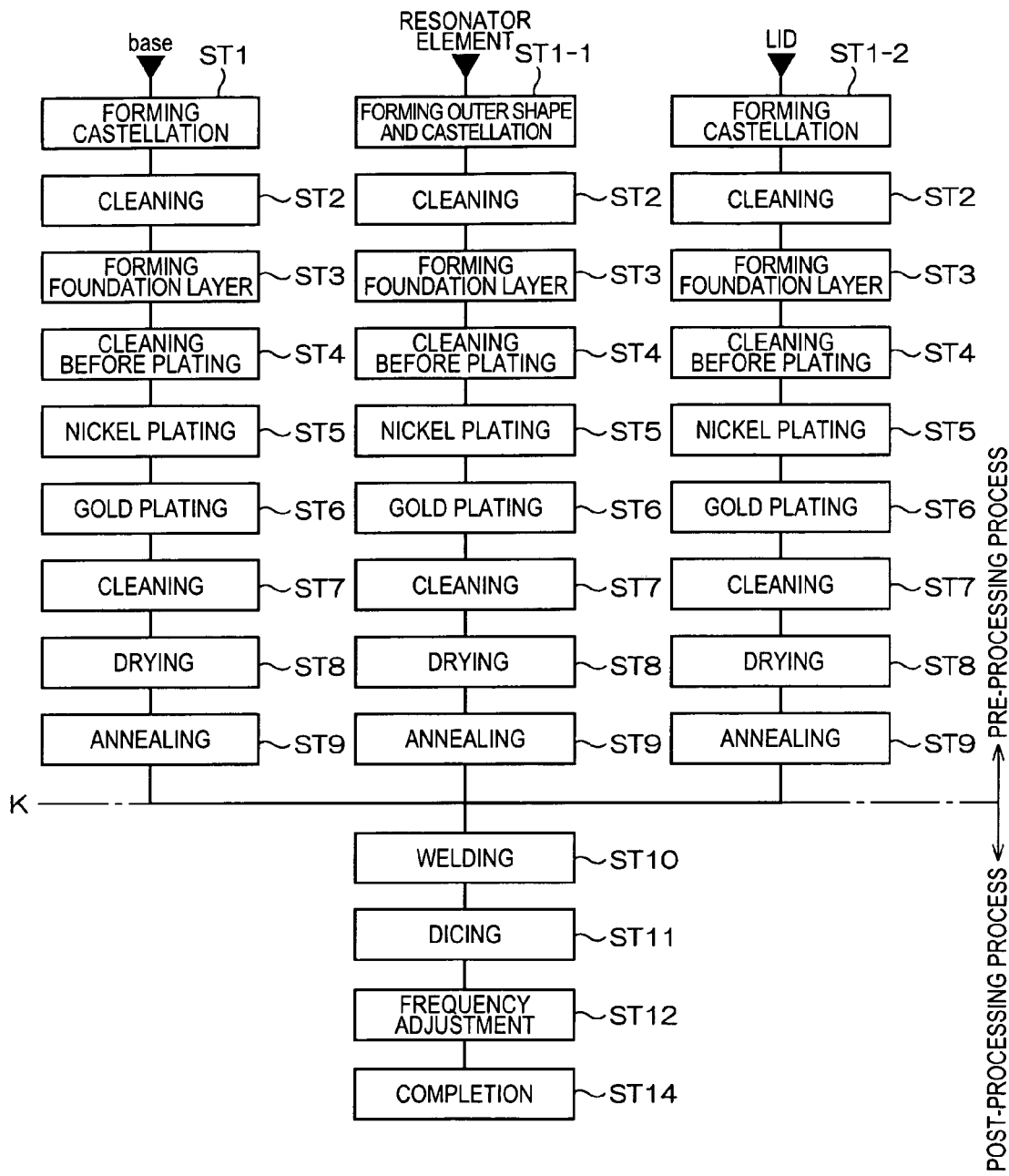
FIG. 3 is a flow chart illustrating a method for manufacturing the piezoelectric device of FIG. 1.

FIG. 1 and FIG. 2 each show a first configuration of a piezoelectric device according to the present teachings. FIG. 1 is a schematic plan view thereof and FIG. 2 is a schematic sectional view taken along the line A-A of FIG. 1.

In those figures, an example of the piezoelectric device 30 having a piezoelectric resonator element therein is shown. The piezoelectric 30 contains the piezoelectric resonator element in the package 37.

To be more specific, the piezoelectric device 30 includes a base substrate 31 serving as a base substrate, a framed resonator element 32 stacked and fixed on the base substrate 31, and a lid 33 stacked and fixed on the framed resonator element 32.

In the case of this piezoelectric device 30, the above-mentioned package 37 hermetically contains a piezoelectric resonator element, and is constituted by including the base substrate 31, a frame portion of the framed resonator element 32, and the lid 33. The base substrate 31, the frame portion of the framed resonator element 32 and the lid 33 coincide in outer shape with each other.

The base substrate 31 is an insulating substrate and made from insulating materials described later. The base substrate 31 constitutes the bottom of the package 37.

The framed resonator element 32 is made from piezoelectric materials. According to this configuration, quartz is used as piezoelectric materials constituting the framed resonator element 32. In addition to quartz, it is possible to use piezoelectric materials such as lithium tantalate or lithium niobate. According to this configuration, wafer formed by quartz Z plate is used.

As is apparent from referring to FIG. 1 and FIG. 2, there are included a resonator element main body 39, a frame portion 36 integrated in the resonator element main body 39 and surrounding the same in a rectangular frame manner.

As is apparent from referring to FIG. 1 and FIG. 2, the resonator element main body 39 has a pair of resonating arms 34, 35 extending rightward of figures from a base portion integrated in the frame portion 36 parallel to each other. As shown in FIG. 1, in the front side and the back side of each of the resonating arms 34, 35, there are formed longitudinal grooves extending in the length direction of each of the resonating arms.

In the longitudinal grooves, there are formed excitation electrodes 14, 13. The excitation electrode 14 pairs off with the excitation electrode 13. They are heteropoler to each other and forms efficiently electrolysis in the resonator element main body 39. Therefore, as shown in FIG. 1, one of the excitation electrodes is arranged in the above mentioned longitudinal grooves of each of the resonating arms 34, 35 and the other of the excitation electrodes is arranged in the lateral portion of each of the resonating arms 34, 35. Each of the excitation electrodes 13, 14 are run around the base portion, which is the front side and the back side thereof, thereby forming extraction electrodes 13a, 14a.

As shown in FIG. 2, mounting terminals 47, 48 are formed at respective longitudinal ends of the back side (bottom surface) of the base substrate 31. In this regard, the excitation electrodes 13a, 14a formed on the base portion of the resonator element main body 39 are electrically connected to mounting terminals 47, 48 through conductive patterns and the conductive though holes (not shown) formed on the base substrate 31, respectively.

The lid 33 is fixed n the framed resonator element 32, as described later. The lid 33 hermetically seals the space in which the resonator element main body 39 is contained.

According to this configuration in particular, for materials of the lid 33, materials, though which light for frequency adjustment (for example, laser light) can be passed, are selected and transparent materials are preferable. The lid 33 is formed as described later. The lid 33 is preferably formed by a quartz Z plate, for example, thereby making it possible to make the materials for the lid 33 identical to those of the framed resonator element 32, which is an object for bonding, so that the lid 33 and the framed resonator element 32 have the same linear coefficient expansion.

Here, the base substrate 31 and the framed resonator element 32, and the framed resonator element 32 and the lid 33 are respectively bonded by solder 49, 49.

In this case, it is ensured that the solder 49, 49 have enough thickness so as to serve as spacer and, as shown in FIG. 2, predetermined gaps G1, G2 in the upper side and the bottom side of the resonator element main body 39 in the internal space S of the package 37. As a result, the resonating element main body 39 can easily perform required resonation without abutting the lid 33 or the inner surface of the base substrate 31.

Next, the sealed structure of the package 37 will be described.

As is apparent form the enlarged view of FIG. 2, a metal layer 25 or metalized portion is formed on the entire sealing surface of the lid 33 or the part thereof, or at least sealing portion (the portion to be bonded to solder 49).

As shown in FIG. 2, a layer identical to the metal layer 25 is also formed on the sealing portion of the framed resonator element 32. To be more specific, the identical metal layers are formed on the sealing portion of the back side of the framed resonator element 32 and the sealing portion of the front side of the base substrate 31, thereby making it possible to solder-bond those portions to each other through the intermediation of solder 49.

The metal layers 25 formed on any members have the same structure, so the metal layer 25 of the lid 33 only will be representatively described later.

As is apparent form the enlarged view of FIG. 2, the above-mentioned metal layer 25 includes, seen from the further side of the solder 49, a foundation layer 21, a platable layer 22 formed on the front side of the foundation layer 21, a barrier layer 23 formed on the front side of the platable layer 22, and a bonding layer 24 formed on the front side of the barrier layer 23.

The foundation layer 21 is disposed so as to reinforce the adhesiveness of the metal such as Au to glass, quartz or the like and may be omitted.

Chrome (Cr), for example, is formed on the foundation layer 21 by sputtering or the like. The film thickness of the foundation layer 21 is preferable be about 100 to 500 Å. When the film thickness of the foundation layer 21 is thinner than 100 Å, a fear arises in that the foundation layer 21 can not sufficiently perform the function as a foundation. When the film thickness of the foundation layer 21 is thicker than 500 Å, the film stress due to layer formation acts hard and may cause interface detachment after plating. It is also possible to use titanium (Ti) for the foundation layer 21 because of its excellent adhesiveness to glass or the like.

The platable layer 22 on the foundation layer 21 is a metal layer that makes it possible to perform plating in the following steps. That is to say, afterwards, gold (Au) layer is formed in the case in which the metal film on the front side of the platable layer 22 is formed by electrolytic plating.

When electroless plating is utilized, aluminum layer is formed. However, aluminum layer only has insufficient water tightness, so it is preferable to use for a platable layer any one selected from AlCu, AlTi and AlSiCu. When a metal layer including those types of aluminums are used for the platable layer 22, the foundation layer 21 is not necessary and the platable layer 22 can be formed on the surface of the lid by sputtering or the like.

The barrier layer 23 is formed on the surface side of the platable layer 22 by plating. The barrier layer 23 is a metal layer that prevents gold constituting the bonding layer 24 from being corroded or ablated. As the barrier layer 23, nickel (Ni) layer, for example, is formed.

Gold (Au) is selected for the bonding layer 24 in order to bond the bonding layer 24 to the solder 49 made from Au—Ge.

By soldering a ring-shape solder alloy made from Au—Ge between those metal layers 25, 25, the package 37 is hermetically bonded and sealed.

The piezoelectric device 30 according to this configuration of the present teachings is thus constructed. The mounting terminals 47, 48 are bonded by soldering etc. to the predetermined mounting substrate (not shown), so that drive voltage supplied from the mounting substrate side is applied to the excitation electrodes 13, 14 of the resonator element main body 39, thereby making it possible to bend and resonate the resonating arms 34, 35 with predetermined frequency so that the ends of the resonating arms 34, 35 come close to and away from each other.

The lid 33 is formed from materials, through which light can be passed through, that is, glass other than metal, thereby making it possible to perform processing of the internal portion of the lid by irradiating it with laser light B from outside after the lid has been sealed, as shown in FIG. 2.

Further, the metal layer 25 is formed on at least sealing portion of the lid 33, to which bonding can be performed by using Au—Ge 49.

To be more specific, the metal layer 25 includes platable layer 22. Therefore, it is possible to form metal layer by plating on the side which is closer to the front side than the platable layer 22. The bonding layer 24 made from gold is formed, thereby making it possible to perform hermetic sealing by using solder so that the use of lead can be avoided depending on the selection of materials.

Therefore, it is possible to provide the piezoelectric device 30, which can be accurately and easily manufactured even if it is downsized and whose cost can be kept low and preventing adverse effects on environment by avoiding the use of lead.

(The Method for manufacturing the Piezoelectric Device)

Next, a method for manufacturing the piezoelectric device 30 will be described.

FIG. 3 is a flow chart showing an example of the method for manufacturing the piezoelectric device 30. The steps of the method for manufacturing the piezoelectric device 30 are divided into the pre-processing process and post-processing process, as is indicated by the chain line K of FIG. 3.

(Pre-Processing Process)

The pre-processing process of the method for manufacturing the piezoelectric device 30, includes a step for forming a base substrate layer (left view of FIG. 3), a step for forming an element layer that is used for forming the framed resonator element (center view of FIG. 3), and a step for forming a lid layer (right view of FIG. 3). The step for forming the base substrate layer, the step for forming the element layer, and the step for forming the lid layer are independently performed. That is to say, the pre-processing process is preparation process for assembly and includes a plurality of steps, which are performed in parallel. Those steps are performed by using substantially the same technique and therefore collectively described with reference to FIG. 4 and FIG. 5.

Figure 4A:
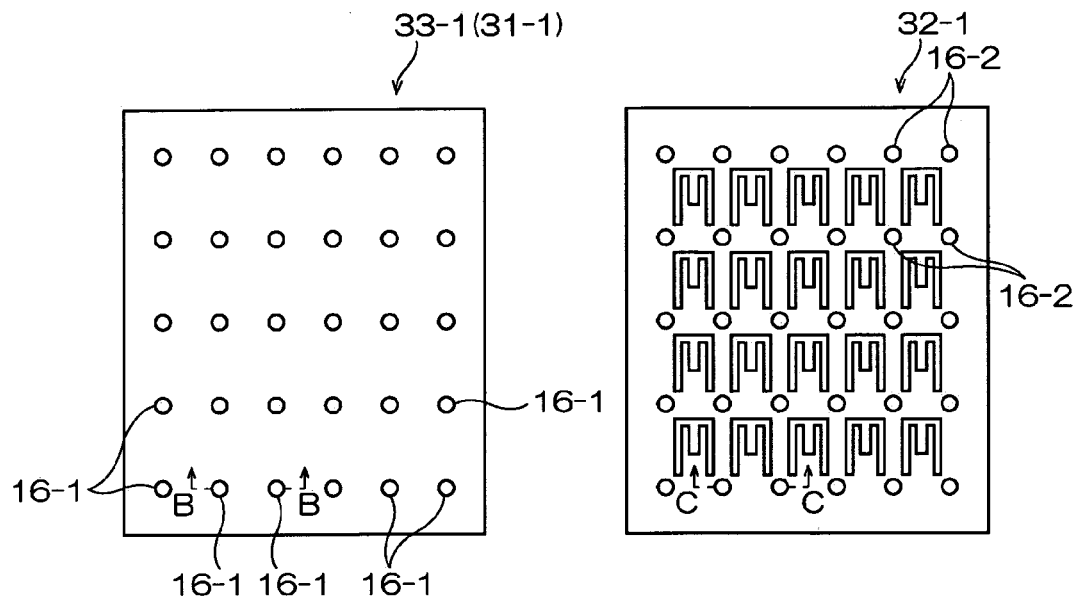
FIG. 4 is a process chart sequentially illustrating an example of steps of manufacturing the piezoelectric device of FIG. 1.

The left view of FIG. 4(a) shows the lid layer 33-1 and the base substrate layer 31-1, which has the same shape as the lid layer 33-1. Those are wafers each having such size that more than one the lid 33 and the base substrate 31, which are described with reference to FIG. 2, can be formed at once. As is the case of this configuration, when the plurality of lid and base substrate can be formed at once, the manufacturing efficiency can be increased.

The wafer, which can be used as the lid layer 33-1, must be formed from transparent materials, through which laser light irradiated from outside can be passed at the time of performing frequency adjustment described later. As the materials for the wafer, quartz, glass or the like can be used. When quartz is used therefor, the same quartz Z-plate as the element layer 32-1 is used. When glass is used, transparent materials having substantially the same coefficient of thermal expansion of 13.8 ppm/1 degree (Celsius) as the quartz Z-plate. For those materials, ordinary soda glass, or borosilicate glass having minimum coefficient of thermal expansion, i. e. PYREX (registered trademark) glass can be used.

Next, as shown in the light view of FIG. 4(a), castellation 16-1 is formed at each of the portions corresponding to the corners of the product, which are to be cross-points of cutting lines described later (ST 1-2).

Figure 4B:
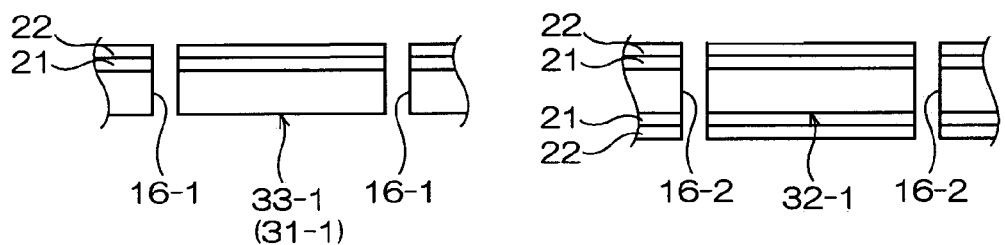
Figure 4C:
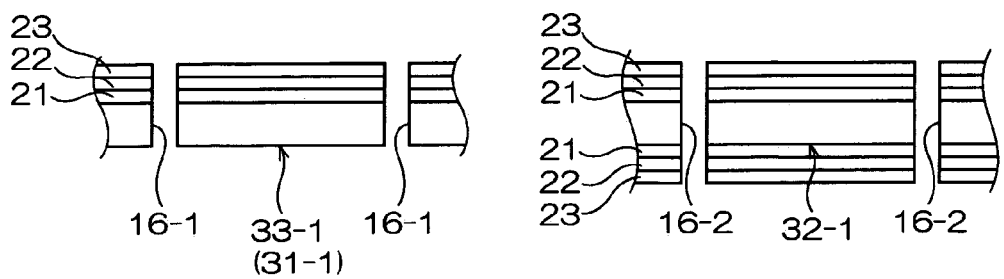
Figure 5D:
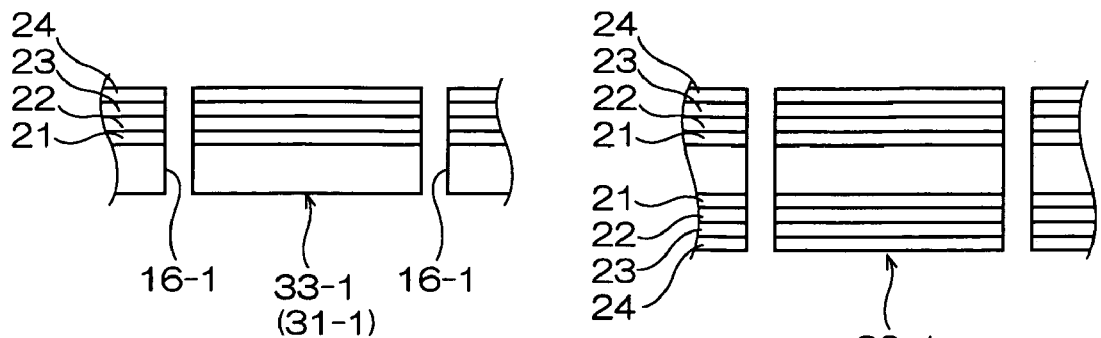
FIG. 5 is a process chart sequentially illustrating an example of steps of manufacturing the piezoelectric device of FIG. 1.

FIG. 4(b) and FIG. 4(c) each show the sectional end view taken along with the line B-B of FIG. 4(a) (the left view), and FIG. 5(d) shows the sectional end view taken along with the line C-C of FIG. 4(a) (the right view).

FIG. 4(b) and FIG. 4(c) regarding the left view will be described in turn.

After cleaning by purified water (ST2), as shown in FIG. 4(b), a layer made from chrome is formed as the foundation layer 22 by sputtering (ST3). The reason for forming the foundation layer 21 and the film thickness thereof are as described above.

Next, as shown in FIG. 4(b), the platable layer 22 is formed.

Gold (Au) is formed on the platable layer 22 by, for example, sputtering, when electrolysis plating is performed in the following steps. The film thickness of the platable layer 22 is preferably substantially smaller than or equal to 20000 Å.

When electroless plating is utilized in the following process, aluminum layer is formed by sputtering or the like. However, aluminum only has insufficient water tightness, so it is preferable to use for a platable layer any gold layer selected from AlCu, AlTi and AlSiCu. In this case, the film thickness preferably falls within the range of substantially 5000 to 8000 Å. The reason why the film thickness becomes rather thick is as follows: In the following zincate treatment at the time of electroless plating, about 3000 Å of the platable layer is etched. When the foundation layer 21 is not formed, the platable layer 22 may be formed on the surface of the lid by sputtering.

Next, cleaning is performed before washing. (ST4)

When gold layer is formed as the platable layer 22, oxidized layer is removed from the surface thereof, to which sputtering is performed, by cleaning with the aid of hydrochloric acid and organic contamination is also removed. Next, the remaining hydrochloric acid is cleaned by using purified water, and the contamination of plating liquid in the following plating step is prevented.

When an aluminum alloy (AlCu, AlTi, AlSiCu etc.) is used for the platable layer 22, oxidized layer is removed from the surface, to which sputtering is performed, by cleaning using hydrofluoric acid surfactant, and the organic contamination is removed therefrom. Then, the remaining hydrofluoric acid is cleaned by using purified water, thereby preventing the contamination of plating liquid in thee following plating step.

Next, as shown in FIG. 4(c), the barrier layer 23 is formed (ST5).

As described above, the barrier layer 23 is formed so as to prevent the bonding layer 24 from being corroded by chrome of the foundation layer 21 or chrome from spreading into the bonding layer 24 and avoiding the wetting of solder. Nickel (Ni) layer is formed as the barrier layer 23.

To be more specific, when a gold layer is formed as the platable layer 22, it is possible to perform electrolysis plating with the aid of nickel sulfamate.

Alternatively, when a layer made from aluminum alloy (AlCu, AlTi, AlSiCu etc.) is formed as the platable layer 22, zincate treatment (ZnO) is performed for zinc substitution treatment of the aluminum surface, which is necessary for electroless plating. Then, water cleaning is performed and electroless plating of nickel sulfate and inorganic phosphorus compounds.

Note that in the each case the film thickness of nickel is preferably about 1 to 3 micron meters (μm).

Next, as shown in FIG. 5(d), the bonding layer 24 is formed by gold plating (ST6).

That is to say, gold (Au) is selected for the bonding layer 24 in order to bond it to solder 49 made from an Au—Ge alloy. The film thickness thereof is preferably about 1 to 3 μm. Gold is expensive, therefore it is preferable to form layer made from gold as thin as possible.

Then, cleaning by using purified water is performed for about 3 minutes (ST7). The surface is exposed to hot air at the temperature of 90 degree (Celsius) for about 3 minutes (ST8). Heating (annealing) is carried out at the temperature of 200 degree (Celsius) with the view to solid-phase diffusion for about 30 minutes. In this case, when annealing is performed for more than necessary minutes, the plating surface is crystallized and solder wettability is deteriorated.

As shown in FIG. 3, the above steps are performed also for the base substrate layer 31-1. That is, the base substrate layer 31-1 can be formed from materials identical to the above-mentioned lid layer 33-1. Therefore, in the case of the base substrate layer 31-1, metal layer can be formed in the same steps as in the case of the lid layer 33-1.

Further, as described above, also for the element layer constituting the framed resonator element, it is possible to form metal layer in the same steps described above, as shown in FIG. 4 and the right view of FIG. 5(d), after forming the outer shape shown in FIG. 1 by using a crystal wafer and performing etching with the aid of fluoric acid solution.

In this case, the element layer 32-1 differs from the lid layer 33-1 in that for the element layer 32-1 the framed resonator element 32 to be formed is bonded in the sate in which it is sandwiched between the base substrate 31 and the lid 33, so it is only needed when metal layer is formed on the front side and the backside of the element layer 32-1. Therefore, the detailed explanation of the formation process of the element layer 32-1 will be omitted.

(Post-Process)

Figure 5E:
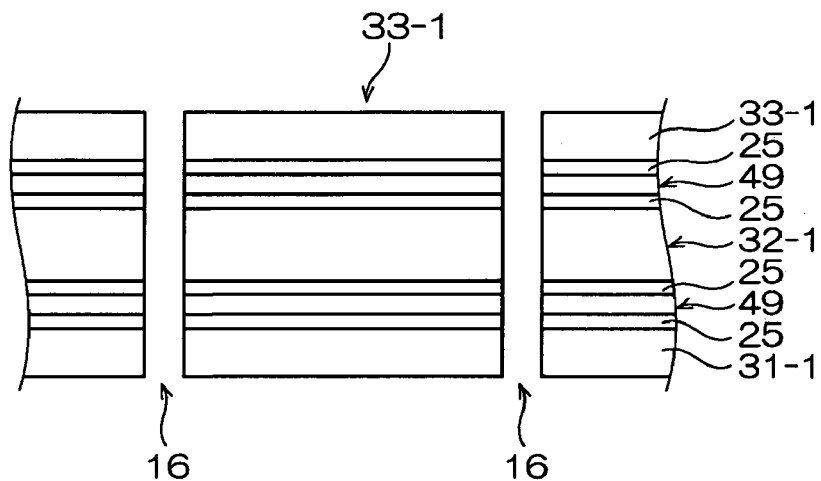

Next, as shown in FIG. 5(e), the base substrate layer 31-1 and the lid layer 33-1 are arranged in a manner that the base substrate layer 31-1 is provided on the top of ring-shaped solder material of Au—Ge and the lid layer 33-1 is on the bottom thereof. Further, by heating the solder 49 up to its melting temperature, the solder 49 is melt to be wet and spread over the respective metal layers 25, thereby performing solder-depositing (ST10).

Figure 5F:
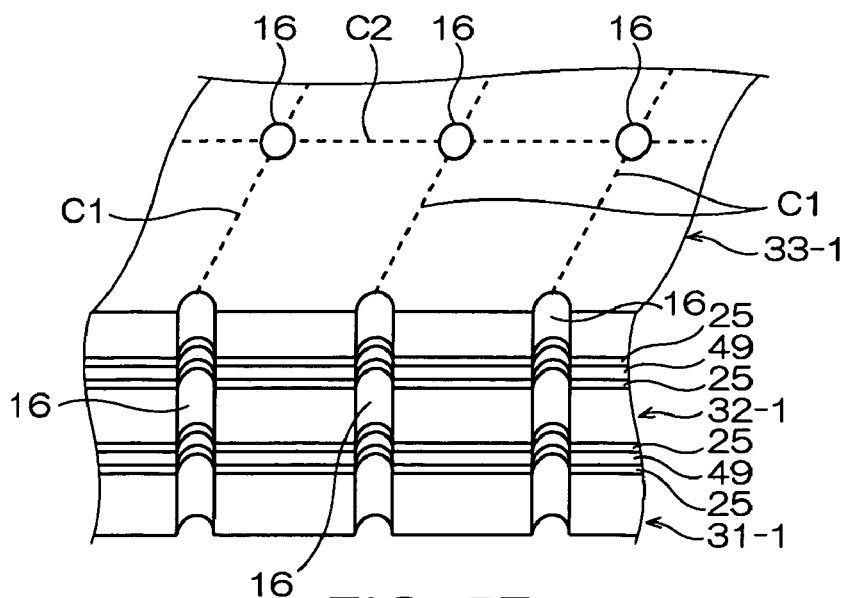

Furthermore, as shown in FIG. 5(f), cutting is performed along each of longitudinal and lateral cutting lines C1 and C2, whose cross-points each exist on the castellation 16 (ST11).

Moreover, as shown in FIG. 2, by irradiating the excitation electrode in the vicinity of end portion of the resonator element main body 39 with the laser light B from outside into the internal portion, frequency adjustment according to mass reduction technique is performed (ST12). Then, necessary inspection is carried out with respect to the respective products and the piezoelectric device 30 is completed.

Figure 6:
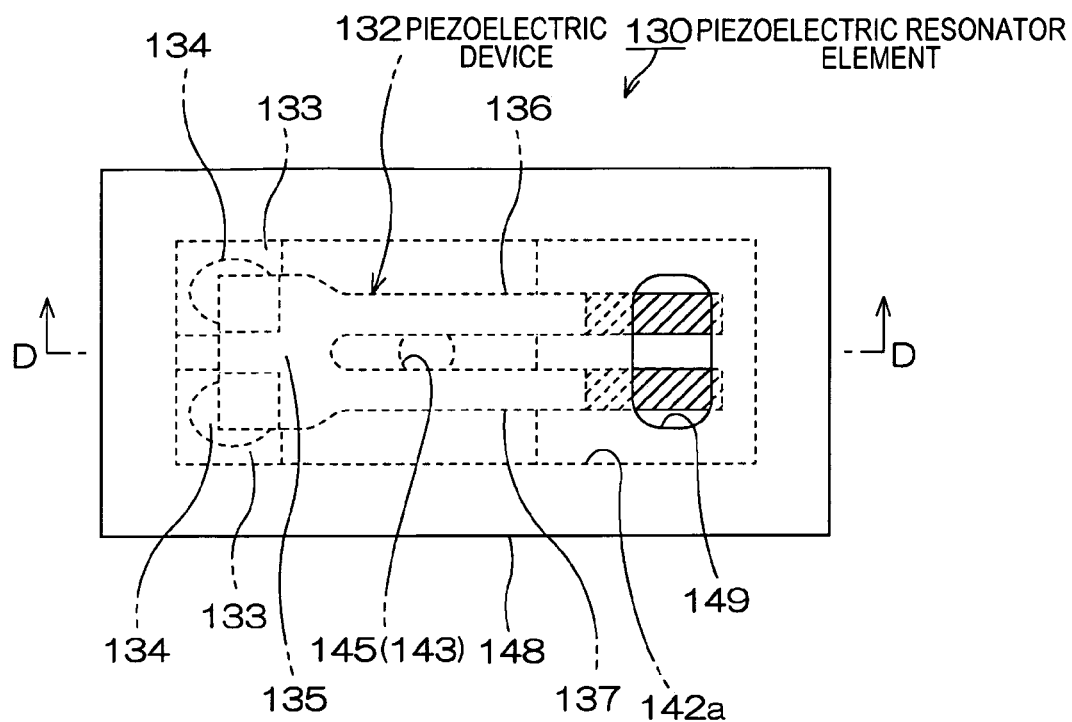
FIG. 6 is a schematic plan view showing a second configuration of a piezoelectric device according to the present teachings.
Figure 7:
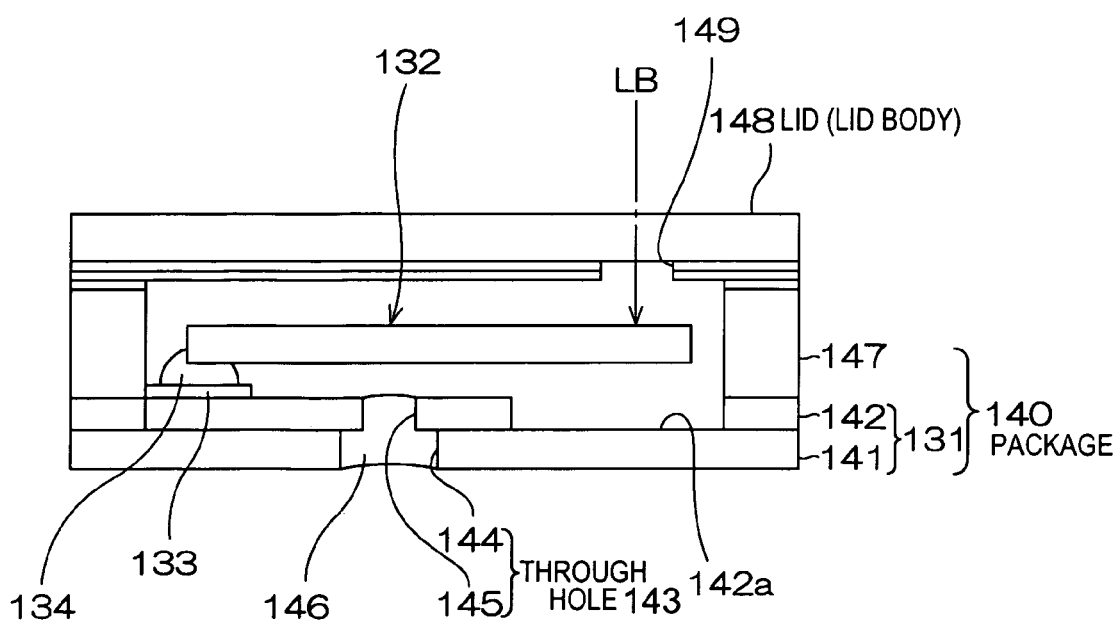
FIG. 7 is a schematic sectional end view taken along the line D-D of FIG. 6.
Figure 8:
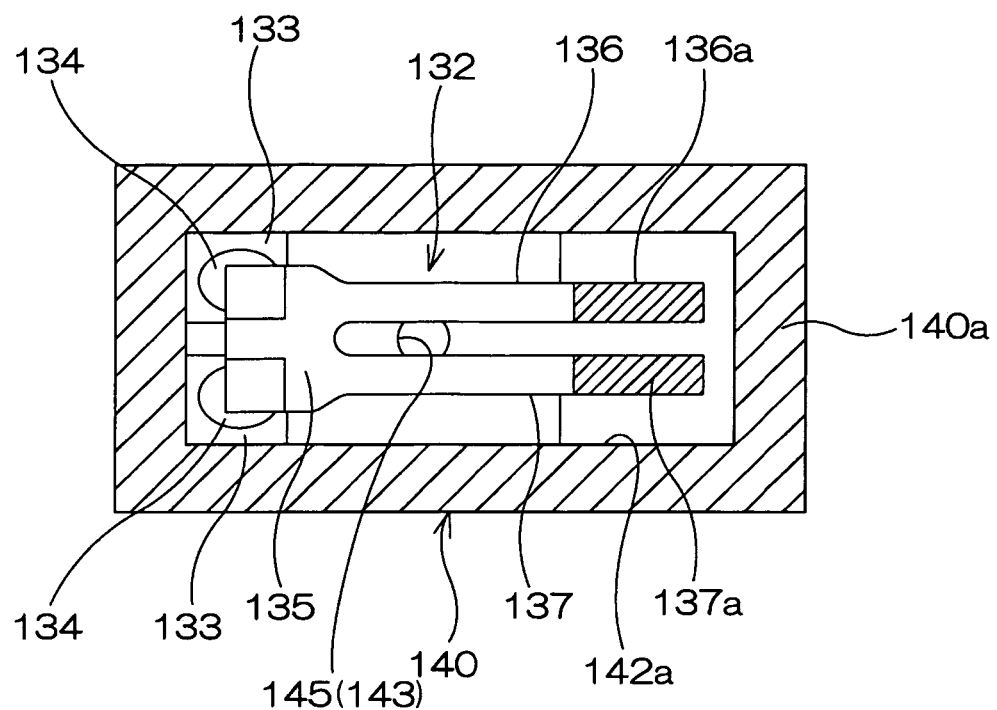
FIG. 8 is a schematic plan view with the lid of the piezoelectric device of FIG. 6 being removed therefrom.

FIG. 6 and FIG. 7 each show a second configuration of the piezoelectric device according to the present teachings. FIG. 6 is a schematic plan view thereof and FIG. 7 is a schematic sectional end view taken along the line D-D of FIG. 6. FIG. 8 is a schematic plan view with the lid being removed.

Those figures each show an example in which as the piezoelectric device 130 a piezoelectric resonator is used. The piezoelectric device 130 contains the piezoelectric resonator element 132 in the package 140 and has a structure hermetically sealed by the lid (lid body) 148.

To be more specific, the package 140 of the piezoelectric device 130 hermetically contains the piezoelectric resonator element and is formed as follows: A plurality of substrates formed by molding of the ceramic green sheet made from aluminum oxide is stacked on each other and undergoes sintering. That is to say, the package 140 has a first substrate 141 serving as the base substrate 131, a second substrate 142 stacked on the first substrate 141, and a third substrate 147 further stacked on the second substrate 142.

The first substrate 141 of the package 140 constitutes the package bottom surface. At the end portions of the second substrate 142 to be stacked on the first substrate 141, for example, in the vicinity of the left end portions shown in FIG. 6 and FIG. 7, there are respectively formed electrode portions 133, 133 in the width direction. The portions for the extraction electrodes of the proximal portion of the piezoelectric resonator element are mounted on and bonded to the respective electrode portions 133, 133 by conductive adhesive 134, 134. Note that the electrode portions 133, 133 are connected to mounting terminals, which are external electrodes (not shown) of the package 140, by utilizing conductive through holes (not shown).

As shown in FIG. 7, a recess 142a is formed in the bottom of the end portion of the piezoelectric resonator element 132 of the second substrate 142 by cutting away the material thereof in a recess-like manner, thereby preventing the end portion from hitting on the internal bottom portion of the package 140 and being damaged even if the end portion of the piezoelectric resonator element 132 vibrates in the vertical direction due to the vibration from the outside.

In the substantially central portions of the first substrate 141 and the second substrate 142, there are formed through holes 143. In this configuration, the through holes has a first hole 144 formed in the first substrate 141, and a second hole 145 formed in the second substrate 142 and having smaller diameter than that of the first hole 144. The first hole 144 and the second hole 145 are continuously formed. As shown in figures, the through hole 143 is a stepped hole. At the step portion thereof, there is formed a conductive pattern (metal coated portion) (not shown). The through hole 143 is filled with metal filler material 146 and thereby sealed.

The piezoelectric resonator element 132 shown in FIG. 8 is made from, for example, quartz. Other than quartz, it is possible to use piezoelectric materials such as lithium tantalate, lithium niobate or the like. As shown in FIG. 6, the piezoelectric resonator element 132 is so called tuning fork resonator element having a base portion 135 to be fixed on the package 140, and a pair of resonating arms 136, 137 diverging from the base portion 135 and extending in parallel with each other rightwards of the figure. The piezoelectric resonator element is not limited thereto but may be, for example, AT cut resonator element obtained by cutting quartz wafer in a rectangular shape.

An extraction electrode is formed on the base portion 135 of the piezoelectric resonator element 132, which is electrically connected to the package 140 side electrode portions 133, 133. Preferably, longitudinal grooves having the same form are respectively formed on the front side and the back side of each of the resonating arms 136, 137 so as to extend in the direction in which the arms extend. Excitation electrodes for driving can be formed and connected to the above-mentioned extraction electrodes.

Next, in the vicinity of, for example, the end portions of each of the resonating arms 136, 137 of the piezoelectric resonator element 132, there are formed metal coated portion 136a, 137a for frequency adjustment. Those metal coated portions 136a, 137a can be obtained by using the same metal of the excitation electrode (not shown) and in the same process thereof. The excitation electrode is an electrode for driving formed on the piezoelectric resonator element 132. Alternatively, the metal coated portions 136a, 137a for frequency adjustment may be formed from a part of the excitation electrode of the piezoelectric resonator element 132.

The lid (lid body) 148 is made from glass and obtained by cutting out from a plate-like material made from borosilicate glass, for example. The lid side metal film and solder of Au—Ge alloy are provided on the bonding surface of the lid (lid body) 148.

Here, as shown in FIG. 6, solder is formed in the area except a light passing portion 149 of the lid (lid body) 148. As shown in FIG. 6, the light passing portion 149 of the lid (lid body) 148 is a portion corresponding to the metal coated portions 136a, 137a for frequency adjustment provided on the piezoelectric resonator element 132 after the lid (lid body) 148 has been bonded to the package 140. The light passing portion 149 is an area, through which laser light from the outside passes. In this case, depending on its material, the lid side metal film is not necessarily provided except the light passing portion 149. However, when the amount of light necessary for frequency adjustment cannot be ensured due to great reduction in the light amount of the laser light for frequency adjustment or reflection of a great amount of light, the lid side metal film is formed except the light passing portion 149 as is the case of the solder.

Next, the lid side metal film and the solder will be described.

Figure 9:
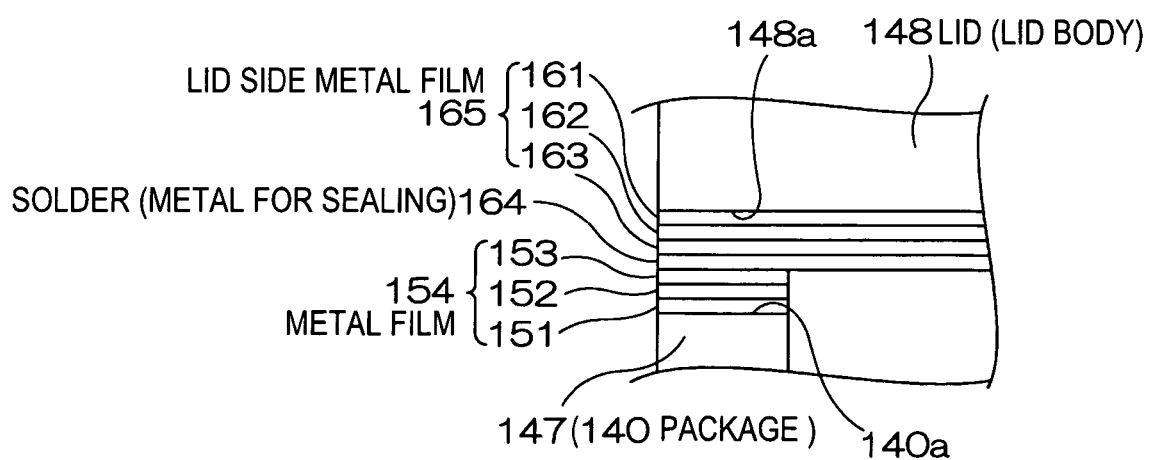
FIG. 9 is an enlarged sectional view showing the bonding portion of the lid and the package of the piezoelectric device of FIG. 6.
Figure 10:
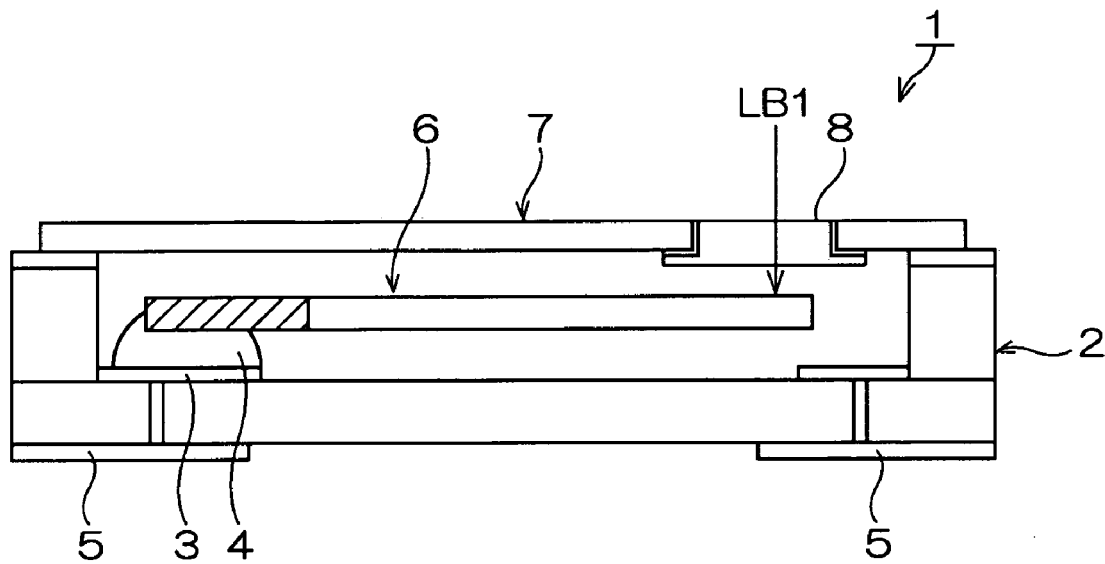
FIG. 10 is a schematic sectional view showing an example of a conventional piezoelectric device.

FIG. 9 is an enlarged partial sectional view showing a bonding portion of the package 140 and the lid (lid body) 148.

In the figure, a metal film 154 is formed on the bonding surface 140a, which is the top of the package 140. The metal film 154 is obtained by coating nickel (Ni) layer 152 on a tungsten (W) layer 151, which serves as foundation for ceramics, for example, and coating gold (Au) layer 153 thereon. Note that the metal layers are shown to be thicker than they really are for easier comprehension.

On the other hand, on the bonding surface 148a, which is one surface of the lid (lid body) 148, there is formed a lid side metal film 165. The lid side metal film 165 is obtained by forming chrome (Cr) layer 161 on a glass surface and forming preferably a nickel (Ni) layer 162 on the surface thereof and further forming a gold (Au) layer 163 on the surface thereof. The nickel layer 162 is provided so as to prevent chrome from spreading from the chrome layer 161 to the gold layer 163.

Each of the layers constituting the lid side metal film 165 can be formed by performing evaporation or sputtering of the metal corresponding to the respective layers to a glass plate. Further, preferably, solder (metal for sealing) 164 is pre-coated on the front side of the lid side metal film 165.

The solder (metal for sealing) 164 is made from an Au—Ge alloy. In this case, the solder (metal for sealing) 164, i. e., sealing material or the Au—Ge alloy constituting the solder can be pre-coated on the side of the lid side metal film 165 by depositing the Au—Ge alloy lightly rolled on the front side of the lid side metal film 165 and formed in a desired shape by using a trimming die.

This configuration of the present teachings is constructed as described above. The steps for manufacturing this configuration will be now briefly explained. First, as pre-process, the package 140 and the lid (lid body) 148 are individually formed.

The step for bonding the piezoelectric resonator element 132 is performed in the state in which the package 140 does not cover the through hole 143.

That is to say, the conductive adhesive 134, 134 is applied on the electrode portions 133, 133 exposed to the internal surface of the package 140. The piezoelectric resonator element 132 is mounted thereon and subjected to drying and curing so that the piezoelectric resonator element 132 is fixed in the package 140.

Then, the package 140 is inserted in the vacuum chamber, for example, and the sealing process is carried out. In this case, the metal film 154, which is described with reference to FIG. 9, is formed in the package 140, the lid side metal film 165 is formed in the lid (lid body) 148, on which the solder (metal for sealing) 164 is pre-coated. Therefore, it is possible to bond and seal the lid (lid body) 148 to the package 140 merely by mounting the lid (lid body) 148 on the package 140 and performing predetermined heating thereto.

In this case, the solder (metal for sealing) 164 is made from an Au—Ge alloy, so it can be melt at the temperature of about 360 degrees. It is possible to perform sealing at the temperature which is not so high as to adversely effect the piezoelectric resonator element 132 and at which the solder is melt and spread in reflow process at the time of mounting the piezoelectric device 130.

At the time of heating, there generated gas such as conductive adhesive for bonding the piezoelectric resonator element 132 or moisture content in the package 140. The gas thus generated is discharged from the through hole 143 to the outside (degassing). After that, a ball like Au—Ge alloy, for example, is arranged on the internal step portion of the through hole 143 and melt by using laser light or the like, thereby obtaining filler metal (metal filling material) 146 and utilizing it to seal the through hole 143.

Finally, as shown in FIG. 7, by irradiation with the laser light LB from the outside, the laser light LB passes through the lid (lid body) 148 to hit on the metal coated portions 136a, 137a (FIG. 8) for frequency adjustment of the piezoelectric resonator element 132 and to make a part thereof to transpire, thereby performing frequency adjustment according to mass reduction technique.

Then, the piezoelectric device 130 is completed.

As described above, according to this configuration of the teachings, the lid (lid body) 148 is made from glass, The lid side metal film 165 is formed so as not to cover the position corresponding to the metal coated portions 136a, 137a for frequency adjustment provided on the piezoelectric resonator element 132 after bonded to the package 140. Therefore, it is possible to perform frequency adjustment according to mass reduction technique by making the metal coated portions 136a, 137a of the piezoelectric resonator element 132 in the package 140 to transpire by irradiation with the laser light LB from the outside.

Further, the solder (metal for sealing) 164 made from an Au—Ge alloy is used for bonding of the lid (lid body) 148 made from glass. Therefore, it can withstand the heat of reflowing at the time of mounting of the piezoelectric device 130. Further, at the same time, adverse effect on the piezoelectric resonator element 132 is prevented at the time of sealing of the lid (lid body) 148.

Moreover, the package 140 has the through hole 143 for sealing. Thus, it is possible to discharge gas from the package 140 through the through hole 143 at the time of sealing of the lid (lid body) 148 and to sealing the through hole afterwards. Therefore, the Cl value is prevented from increasing due to adhesion of gas content to the piezoelectric resonator element 132.

As thus described above, it becomes possible to provide a piezoelectric device having such as structure in which sealing the package and the lid without fear of environmental contamination is performed and frequency adjustment can be accurately performed, and the Cl value can be prevented from increasing.

Note that of the metal layers constituting the lid side metal film 165 the laser light LB can pass through the chrome layer 161 even if the chrome layer 161 covers the light passing portion 149.

Further, the solder (metal for sealing) 164 may be pre-coated on the surface of the metal film 154 on the package 140 side.

Furthermore, the solder (metal for sealing) 164 may be formed only in the region corresponding to the bonding surface 140a of FIG. 9 at the lid (lid body) 148 side or at the package 140 side.

The present teachings are not limited to the configurations described above. The structures of the configurations of the present teachings may be appropriately omitted or combined with other structures not shown.

Moreover, the present teachings may be applied to all types of piezoelectric devices regardless of whether they are called piezoelectric resonator, piezoelectric oscillator, or the like, provided that they contain piezoelectric resonator element covered by a package.

What is claimed is:

1. A hermetically sealed structure comprising:
   a base substrate;
   a lid hermetically bonded to the base substrate by an Au—Ge alloy, the lid being made from a material through which light passes;
   a first metal layer provided on a surface of the lid bonded to the base substrate, the first metal layer including:
      a first foundation layer made from Cr formed on the surface of the lid;
      a first platable layer made from either Au or Al alloy formed on the first foundation layer;
      a first bonding layer made from Au, the first bonding layer being formed closer to the Au—Ge alloy than the first platable layer; and
      a first barrier layer made from Ni formed between the first platable layer and the first bonding layer;
   a second metal layer provided on a surface of the base substrate bonded to the lid, the second metal layer including:
      a second foundation layer made from Cr formed on the surface of the base substrate;
      a second platable layer made from either Au or Al alloy formed on the second foundation layer;
      a second bonding layer made from Au, the second bonding layer being formed closer to the Au—Ge alloy than the second platable layer;
      a second barrier layer made from Ni formed between the second platable layer and the second bonding layer;
   wherein the Au—Ge alloy is sandwiched between the first metal layer and the second metal layer; and
   the base substrate serves as a part of a containing body for a piezoelectric device.

2. A piezoelectric device comprising:
   a base substrate;
   a first Au—Ge alloy formed on the base substrate;
   a framed resonator element fixed to the base substrate by the first Au—Ge alloy;
   a second Au—Ge alloy formed on the framed resonator element;
   a lid fixed to the framed resonator element by the second Au—Ge alloy, the lid being formed from a material through which light passes; and
   first and second pairs of metal layers that sandwich the first and second Au—Ge alloys, respectively, each of the metal layers including:
      a foundation layer made from Cr;
      a platable layer including either Au or Al alloy formed on the first foundation layer;
      a bonding layer made from Au, the bonding layer being formed closer to the respective Au—Ge alloy than the platable layer; and
      a barrier layer made from Ni formed between the platable layer and the bonding layer.

3. The piezoelectric device according to claim 2, wherein the platable layer being one selected from the group consisting of AlCu, AlTi, AlSiCu, and Au.

4. The piezoelectric device according to claim 2, wherein the base substrate, the framed resonator element, and the lid are made from quartz.

5. The piezoelectric device according to claim 2, wherein the base substrate and the lid are made from glass, and the framed resonator element is made from quartz.

6. A piezoelectric device comprising:
   a base substrate;
   a first Au—Ge alloy formed on the base substrate;
   a piezoelectric resonator element fixed to the base substrate by the first Au—Ge alloy;
   a second Au—Ge alloy formed on the resonator element;
   a lid fixed to the resonator element by the second Au—Ge alloy, the lid being formed from a material through which light passes; and
   first and second pairs of metal layers that sandwich the first and second Au—Ge alloys, respectively, each of the metal layers including:
      a foundation layer made from Cr;
      a platable layer including either Au or Al alloy formed on the first foundation layer;
      a bonding layer made from Au, the bonding layer being formed closer to the respective Au—Ge alloy than the platable layer; and
      a barrier layer made from Ni formed between the platable layer and the bonding layer,
   wherein the base substrate has a thorough hole sealed by a filler material.

7. The piezoelectric device according to claim 6, wherein the metal layers and the Au—Ge alloys are provided around a perimeter of the base substrate and the lid.

8. The piezoelectric device according to claim 6, wherein the filler material includes a metal material.

* * * * *